(12) United States Patent
Oratti Kalandar et al.

(10) Patent No.: US 9,947,614 B2
(45) Date of Patent: Apr. 17, 2018

(54) PACKAGED SEMICONDUCTOR DEVICE HAVING BENT LEADS AND METHOD FOR FORMING

(71) Applicant: FREESCALE SEMICONDUCTOR, INC., Austin, TX (US)

(72) Inventors: Navas Khan Oratti Kalandar, Austin, TX (US); Nishant Lakhera, Austin, TX (US); Boon Yew Low, Subang Jaya (MY); Akhilesh Singh, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/064,689

(22) Filed: Mar. 9, 2016

(65) Prior Publication Data
US 2017/0263538 A1    Sep. 14, 2017

(51) Int. Cl.
| H01L 23/495 | (2006.01) |
| H01L 23/48 | (2006.01) |
| H01L 23/02 | (2006.01) |
| H01L 23/31 | (2006.01) |

(52) U.S. Cl.
CPC .... H01L 23/49575 (2013.01); H01L 23/3114 (2013.01); H01L 23/4952 (2013.01); H01L 23/49513 (2013.01); H01L 23/49548 (2013.01)

(58) Field of Classification Search
CPC ......... H01L 23/49575; H01L 23/49548; H01L 23/49513; H01L 23/3114
USPC .......................................................... 257/692
See application file for complete search history.

(56) References Cited

U.S. PATENT DOCUMENTS

| 5,424,896 A * | 6/1995 | Pasch ...................... H01L 23/60 361/111 |
| 6,878,570 B2 | 4/2005 | Lyu et al. |
| 2004/0232526 A1 | 11/2004 | Ryoo et al. |
| 2006/0186514 A1 | 8/2006 | Shim et al. |
| 2008/0136008 A1 | 6/2008 | Yoon et al. |
| 2008/0182434 A1 | 7/2008 | Goida |
| 2009/0026600 A1 * | 1/2009 | Koon ................ H01L 23/49861 257/686 |
| 2015/0187684 A1 * | 7/2015 | Myung ............... H01L 23/3107 257/670 |
| 2015/0262918 A1 * | 9/2015 | Tran .................... H01L 21/4842 257/676 |

* cited by examiner

*Primary Examiner* — Joseph C Nicely
*Assistant Examiner* — Thai T Vuong

(57) ABSTRACT

A package device has a first lead frame having a first flag. A first integrated circuit is on the first flag. A first encapsulant is over the first integrated circuit. A first plurality of leads is electrically bonded to the first integrated circuit. A first lead of the first plurality of leads has an inner portion covered by the first encapsulant and an outer portion extending outside the encapsulant. The outer portion has a hole and a bend at the hole. The outer portion extends above the first encapsulant.

12 Claims, 5 Drawing Sheets

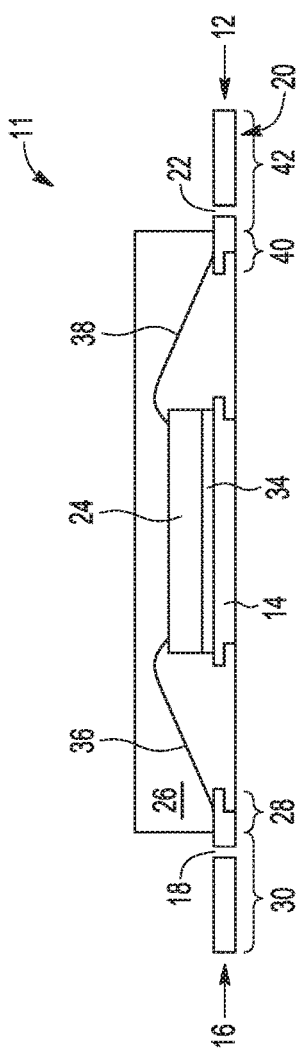
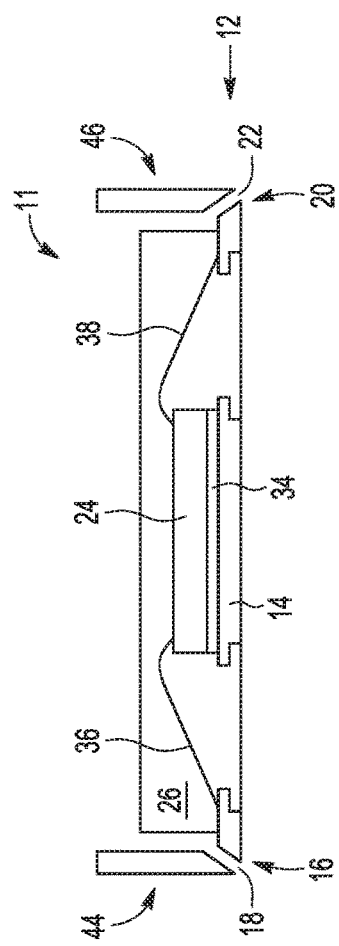

PACKAGED SEMICONDUCTOR DEVICE HAVING BENT LEADS AND METHOD FOR FORMING

BACKGROUND

Field

This disclosure relates generally to semiconductor processing, and more specifically, to a packaged semiconductor device having bent leads.

Related Art

Lead frames are commonly used in semiconductor packaging. However, lead frames make it challenging to stack packaged devices to achieve 3D packaging. Therefore, a need exists for a packaged semiconductor device capable of being utilized with 3D packaging. In this manner, multiple packaged devices can be stacked for reduced area and cost.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 4 illustrates a cross sectional view of the semiconductor structure of FIG. 3.

FIG. 5 illustrates, in cross sectional view, the semiconductor structure of FIG. 4 after bending the leads, in accordance with one embodiment of the present invention.

DETAILED DESCRIPTION

With lead frame packaging, 3-D packaging, in which multiple packaged devices are packaged together, is challenging. The ability to stack multiple packaged devices allows for reduced area of the resulting package, as well as reduced cost. Therefore, in one embodiment, a hole is formed in each lead of a lead frame such that, after the die is encapsulated and singulated, the lead can be bent at the hole. The bent leads may then extend beyond the encapsulant to allow for insertion into corresponding holes of another such packaged device. In this manner, 3-D packaging may be achieved. Furthermore, the stacked lead frame packaged devices can be easily reworked to achieve desired functionality.

Figure 1:
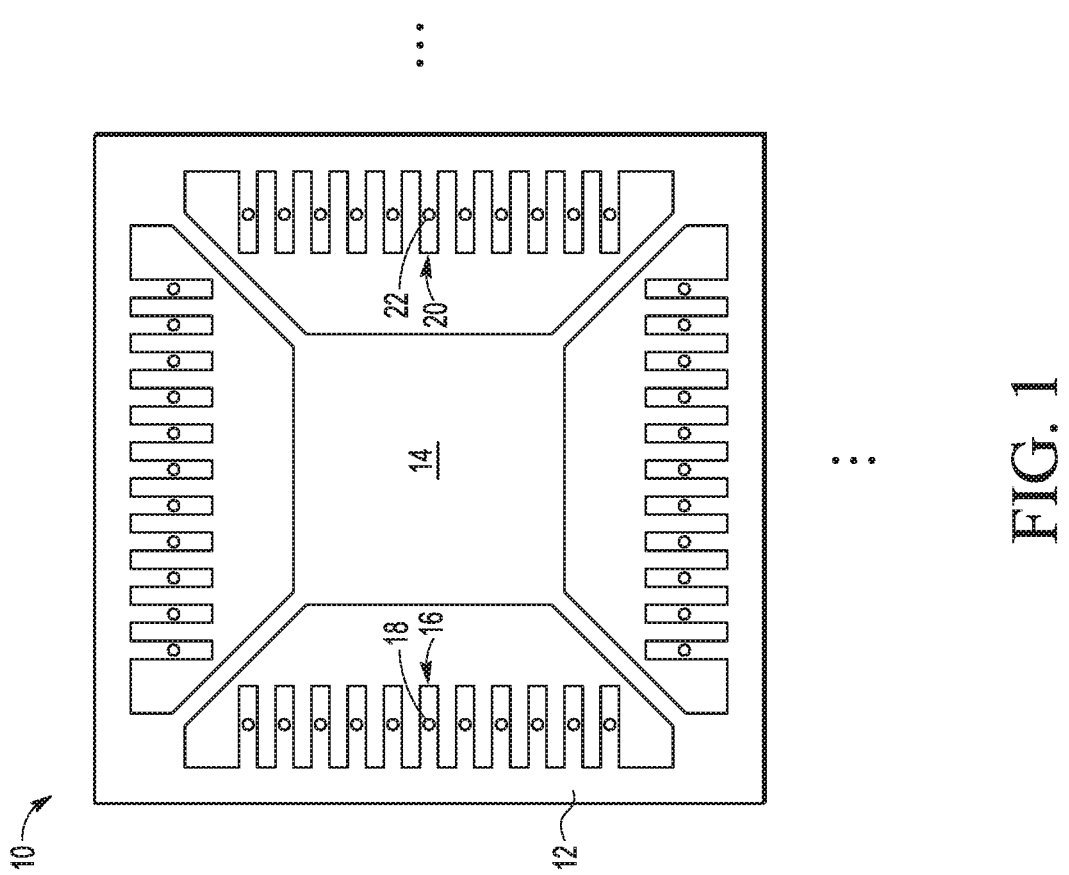
FIG. 1 illustrates a top down view of a semiconductor structure having lead frame in accordance with one embodiment of the present invention.

FIG. 1 illustrates a top down view of a semiconductor structure 10 at an initial stage in processing. Semiconductor structure 10 includes a lead frame 12. Lead frame 12 includes a flag portion 14 and a plurality of leads, such as lead 16 and lead 20. Each lead includes a hole, such as hole 18 in lead 16 and hole 22 in lead 20. The holes are illustrated as ovals, but can be any shape. The leads surround flag portion 14. In the illustrated embodiment, leads are located on all four sides of flag portion 14. Alternatively, depending on the semiconductor die to be attached to flag portion 14, the leads can be along only one, two, or three sides of flag portion 14.

Figure 2:
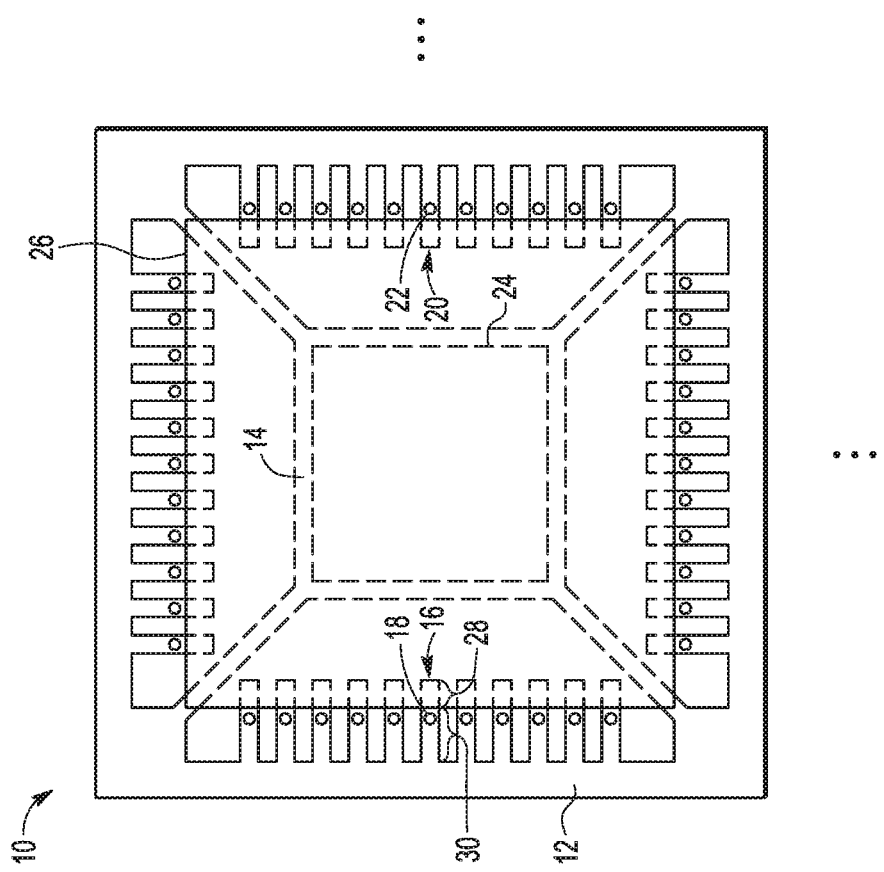
FIG. 2 illustrates the semiconductor structure of FIG. 1 after encapsulation in accordance with one embodiment of the present invention.

FIG. 2 illustrates a top down view of semiconductor structure 10 at a subsequent stage in processing. A semiconductor die 24 is attached to flag portion 14, using, for example, an adhesive material. After attaching die 24 to flag portion 14, electrical interconnects are formed between the leads and contacts on die 24. In one embodiment, the electrical interconnects are implemented as wire bonds. Therefore, wire bonds can be formed from leads of lead frame 12 to contacts at a top surface of die 24. Note that die 24 may also be referred to as an integrated circuit. After formation of the electrical interconnects, an encapsulant 26 is formed over die 24. Encapsulant 26 covers the electrical connects (such as wire bonds) and covers an inner lead portion of each lead and exposes an outer lead portion of each lead. For example, referring to lead 16, encapsulant 26 covers an inner lead portion 28 and does not cover (exposes) an outer lead portion 30. Dambars (not illustrated) may be present at the encapsulant boundary to prevent mold compound bleed out. Note that the holes are located in the outer lead portions of each lead, such as hole 18 in outer lead portion 30, such that encapsulant 26 does not cover the holes. Depending on the lead frame design, the leads can extend from all four sides of encapsulant 26, or may extend from only one, two, or three sides of encapsulant 26.

Figure 3:
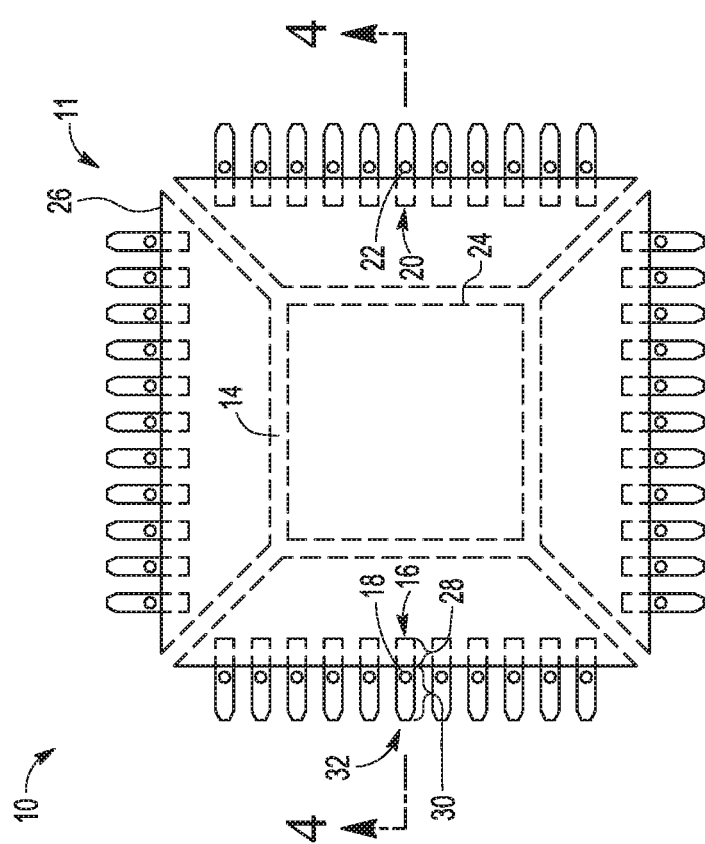
FIG. 3 illustrates the semiconductor structure of FIG. 2 after singulation and trim, in accordance with one embodiment of the present invention.

FIG. 3 illustrates a top down view of semiconductor structure 10 at a subsequent stage in process. After formation of encapsulant 26, lead frame 12 is singulated to separate each packaged semiconductor device, such as packaged semiconductor device 11 illustrated in FIG. 3. Upon singulation, the portion of lead frame 12 between adjacent devices is removed, so as to separate each of the leads from adjacent devices and from each other. In this manner, the leads are no longer shorted to flag portion 14. Also, during singulation, each lead tip is tapered. The tapering can be done in any shape, so long as the width of the tapered tip is less than a width of the holes.

FIG. 4 illustrates a cross-sectional view of packaged device 11 of FIG. 3 taken through leads 16 and 20 and holes 18 and 22. Visible now in the cross section of FIG. 4 are electrical interconnects 36 and 38 which are covered by encapsulant 26, as well as adhesive material 34 which attaches die 24 to flag portion 14. Note that in the illustrated embodiment, electrical interconnects 36 and 38 are illustrated as wire bonds. Also, in the illustrated embodiment, encapsulant 26 covers the top side of die 24 and is substantially coplanar with a bottom surface of lead frame 12. However, in alternate embodiment, encapsulant 26 may also be formed such that it covers the bottom surface of lead frame 12. In this embodiment, holes 18 and 22 would still remain exposed.

FIG. 5 illustrates a cross-sectional view of packaged device 11 of FIG. 4 at a subsequent stage in processing. Each of the leads is bent at the hole such that a portion of the lead extends up beyond encapsulant 26. Therefore, for each lead, a portion of the lead between encapsulant 26 and the hole extends laterally from the encapsulant, and another portion of the lead extends above the encapsulant. The portion of lead 16 which extends from hole 18 to beyond encapsulant 26 is referred to as package interconnect 44, and the portion of lead 20 which extends from hole 22 to beyond encapsulant 26 is referred to as package interconnect 46.

Figure 6:
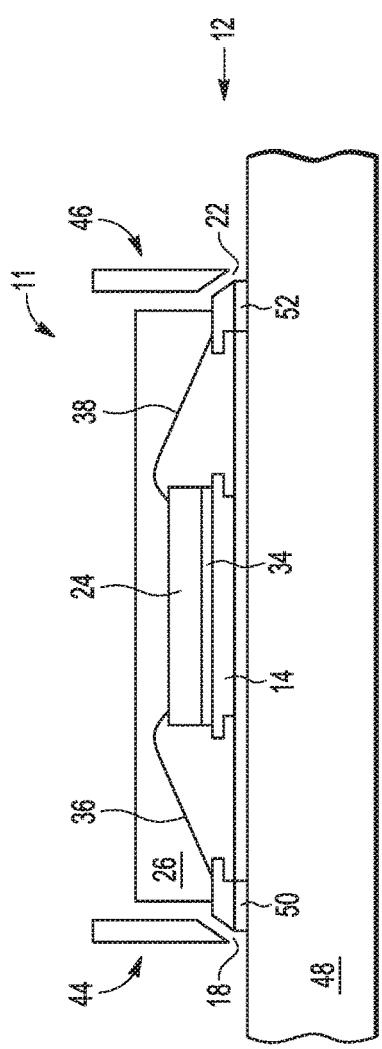
FIG. 6 illustrates, in cross sectional view, the semiconductor structure of FIG. 5 after attaching a first packaged device to a printed circuit board in accordance with one embodiment of the present invention.

FIG. 6 illustrates a cross-sectional view of semiconductor structure 10 at a subsequent stage in processing in which packaged device 11 is attached to a printed circuit board (PCB) 48. Packaged device 11 is attached to PCB 48 via solder joints 50 and 52 between lead frame 12 and PCB 48. Each solder joint is connected between an exposed portion of a lead coplanar with the bottom surface of packaged device 11 and PCB 48.

Figure 7:
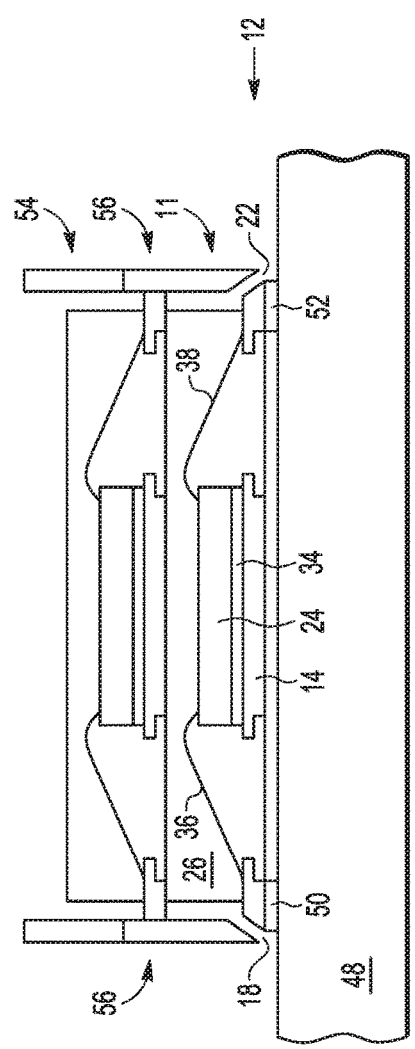
FIG. 7 illustrates, in cross sectional view, the semiconductor structure of FIG. 6 after stacking a second packaged device on the first packaged device in accordance with one embodiment of the present invention.

FIG. 7 illustrates a cross-sectional view of semiconductor structure 10 at a subsequent stage in process in which another packaged device 54 is stacked onto packaged device 11. The lead frame used for packaged device 54 is the same as lead frame 12, in that it also includes holes in each lead. Packaged device 54 is also encapsulated such that the holed in each lead are exposed, and each lead of packaged device 54 is also bent at the hole, such that the leads of packaged device 54 also extend beyond the encapsulant. In one embodiment, packaged devices 11 and 54 are a same size and include a same number of leads such that each lead of packaged device 11 lines up with a corresponding lead of packaged device 54. In stacking packaged device 54 onto packaged device 11, the tapered lead tips of packaged device 11 are inserted into the holes of corresponding leads of packaged device 54, as illustrated at locations 56 in FIG. 7. That is, package interconnect 44 of packaged device 11 inserts into a hole in a corresponding lead of packaged device 54 which aligns to lead 16, and package interconnect 48 of packaged device 11 inserts into a hole in a corresponding lead of packaged device 54 which aligns to lead 20. This ensures that stacked packaged device 54 remains positioned and aligned on top of packaged device 11. The packaged devices may be stacked such that the bottom surface of the encapsulant of the top packaged device contacts the top surface of the encapsulant of the bottom packed device.

In one embodiment, the leads of one packaged device are inserted into corresponding holes in leads of another stacked packaged device along all four sides of the die. Alternatively, depending on the design of the lead frames and packaged devices, they may be formed on only one, two, or three sides of the die. In one embodiment, the holes in packaged semiconductor device 54 each have a first dimension in which a second dimension orthogonal to the first dimension in which the first dimension is less than a width of a corresponding lead of packaged device 11 (which inserts into the hole) and the second dimension is greater than the width.

The holes of a packaged semiconductor device and the corresponding tapered and bent leads which insert into the hole allow for any number if devices to be stacked and thus attached to a same location on a PCB. For example, any number of additional packaged devices can be stacked onto packaged device 54 in a similar manner to how packaged device 54 is stacked onto packaged device 11. In this manner, 3-D packaging can be more easily achieved with lead frame packages, which reduces area and cost. Furthermore, this stacking allows for improved flexibility as packaged devices can be stacked and unstacked, such that their configuration can be reworked, as needed.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the length of the leads can be made as needed so long as the package interconnects extend beyond the encapsulant. Also, the leads can be bent in a variety of ways, rather than straight up, to allows the leads to be inserted into the corresponding hole. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a package device includes a first lead frame having a first flag; a first integrated circuit on the first flag; a first encapsulant over the first integrated circuit; and a first plurality of leads, electrically bonded to the first integrated circuit. A first lead of the first plurality of leads has an inner portion covered by the first encapsulant and an outer portion extending outside the encapsulant, wherein the outer portion has a hole, the outer portion has a bend at the hole, and the outer portion extends above the first encapsulant. In one aspect above the embodiment, the package device further includes a second lead frame having a second flag; a second integrated circuit on the second flag; a second encapsulant over the second integrated circuit and the first encapsulant; a second plurality of leads, electrically bonded to the second integrated circuit, wherein a second lead of the second plurality of leads has an inner portion covered by the second encapsulant and an outer portion extending outside the second encapsulant, and wherein the outer portion of the first lead electrically contacts the second lead. In a further aspect, the second lead has a hole and the first lead enters the hole in the second lead. In yet a further aspect, the second lead has a bend at the hole in the second lead and the second lead extends above the second encapsulant. In yet a further aspect, the outer portion of the first lead has a first portion between the first encapsulant and the hole in the first lead that extends laterally from the first encapsulant and a second portion that extends above the first encapsulant. In yet a further aspect, the second portion of the outer portion of the first lead has a tapered tip where it extends above the first encapsulant. In another aspect, the hole has a first dimension and a second dimension orthogonal to the first dimension in which the first dimension is less than a width of the first lead and the second dimension is greater than the width of the first lead. In another aspect, the first plurality of leads has a first portion extending from a first side of the encapsulant, a second portion extending from a second side of the encapsulant, a third portion extending from a third side of the encapsulant, and a fourth portion extending from a fourth side of the encapsulant. In another aspect, the package device further includes a wire bond coupled between the first integrated circuit and the first lead. In another aspect, the first lead has an exposed portion coplanar with a bottom surface of the package device.

In another embodiment, a method of making a package device includes attaching a first integrated circuit to a flag of a first lead frame having a plurality of leads, wherein each lead of the plurality of leads has a hole; encapsulating the first lead frame resulting in a first encapsulated top surface; and bending the plurality of leads at the holes so that the plurality of leads extend above the first encapsulated top surface. In one aspect of the another embodiment, the method further includes attaching a second integrated circuit to a flag of a second lead frame having a plurality of leads; encapsulating the second lead frame resulting in a second encapsulated top surface and a bottom surface; and attaching the bottom surface to the first encapsulated top surface and contacting the plurality of leads of the first lead frame to the plurality of leads of the second lead frame. In another aspect, the attaching the second integrated circuit to the flag is further characterized as the leads of the second lead frame having holes; and the contacting the plurality of leads is further characterized as contacting the plurality of leads of the first lead frame at the holes of the plurality of leads of the second lead frame. In a further aspect, the method further includes bending the plurality of leads of the second lead frame at the holes so that the plurality of leads of the second lead frame extend above the second encapsulated top surface. In another aspect, the method further includes, prior to encapsulating the first lead frame, coupling the first integrated circuit to the plurality of leads with wire bonds. In another aspect, the encapsulating the first lead frame is further characterized as leaving the plurality of the leads of the first lead frame exposed and coplanar with a bottom surface of the package device. In another aspect, the method further includes tapering ends of the plurality of leads.

In yet another embodiment, a package device includes a first lead frame having a first flag and a first plurality of leads; a first integrated circuit on the first flag; and a first encapsulant over the integrated circuit, the first encapsulant having a top surface, wherein: each lead of the first plurality of leads having a hole and a bend at its hole; and a portion of each lead extending from its hole to above the top surface. In one aspect of the yet another embodiment, the package device further includes a second lead frame having a flag and a first plurality of leads; a second integrated circuit on the second flag; and a first encapsulant over the integrated circuit, the first encapsulant having a top surface, wherein: each lead of the second plurality of leads having a hole and a bend at its hole; each lead of the first plurality of leads corresponding to a lead of the second plurality of leads; and each lead of the first plurality of leads has a portion in the hole of its corresponding lead of the second plurality of leads. In another aspect, a portion of a bottom surface of each lead of the first plurality of leads is exposed.

What is claimed is:
1. A package device, comprising:
a first lead frame having a first flag;
a first integrated circuit on the first flag;
a first encapsulant over the first integrated circuit;
a first plurality of leads, electrically bonded to the first integrated circuit, wherein a first lead of the first plurality of leads has an inner portion covered by the first encapsulant and an outer portion extending outside the encapsulant, wherein:
the outer portion has a hole extending completely through the first lead;
the outer portion has a bend at the hole; and
the outer portion extends above the first encapsulant.
2. The package device of claim 1, further comprising:
a second lead frame having a second flag;
a second integrated circuit on the second flag;
a second encapsulant over the second integrated circuit and the first encapsulant;
a second plurality of leads, electrically bonded to the second integrated circuit, wherein a second lead of the second plurality of leads has an inner portion covered by the second encapsulant and an outer portion extending outside the second encapsulant, wherein:
the outer portion of the first lead electrically contacts the second lead.
3. The package device of claim 2, wherein the second lead has a hole and the first lead enters the hole in the second lead.
4. The package device of claim 3, wherein the second lead has a bend at the hole in the second lead and the second lead extends above the second encapsulant.
5. The package device of claim 4, wherein the outer portion of the first lead has a first portion between the first encapsulant and the hole in the first lead that extends laterally from the first encapsulant and a second portion that extends above the first encapsulant.
6. The package device of claim 5, wherein the second portion of the outer portion of the first lead has a tapered tip where it extends above the first encapsulant.
7. The package device of claim 1, wherein the first plurality of leads has a first portion extending from a first side of the encapsulant, a second portion extending from a second side of the encapsulant, a third portion extending from a third side of the encapsulant, and a fourth portion extending from a fourth side of the encapsulant.
8. The package device of claim 1, further comprising a wire bond coupled between the first integrated circuit and the first lead.
9. The package device of claim 1, wherein the first lead has an exposed portion coplanar with a bottom surface of the package device.
10. A package device, comprising:
a first lead frame having a first flag and a first plurality of leads;
a first integrated circuit on the first flag; and
a first encapsulant over the integrated circuit, the first encapsulant having a top surface,
wherein:
each lead of the first plurality of leads having a hole which extends completely through the lead and a bend at its hole; and a portion of each lead extending from its hole to above the top surface.

11. The package device of claim 10, further comprising:
a second lead frame having a second flag and a second plurality of leads;
a second integrated circuit on the second flag; and
a second encapsulant over the second integrated circuit, the second encapsulant having a top surface,
wherein:
  each lead of the second plurality of leads having a hole which extends completely through the lead and a bend at its hole;
  each lead of the first plurality of leads corresponding to a lead of the second plurality of leads; and
  each lead of the first plurality of leads has a portion in the hole of its corresponding lead of the second plurality of leads.

12. The package device of claim 11, wherein a portion of a bottom surface of each lead of the first plurality of leads is exposed.

* * * * *